(12) United States Patent
Sestok et al.

(10) Patent No.: US 8,547,258 B2
(45) Date of Patent: Oct. 1, 2013

(54) COMPRESSIVE SENSE BASED RECONSTRUCTION IN THE PRESENCE OF FREQUENCY OFFSET

(75) Inventors: Charles K. Sestok, Dallas, TX (US); Andrew Waters, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 13/323,578

(22) Filed: Dec. 12, 2011

(65) Prior Publication Data
US 2013/0147646 A1 Jun. 13, 2013

(51) Int. Cl.
*H03M 1/06* (2006.01)

(52) U.S. Cl.
USPC .......................................... 341/118; 341/155

(58) Field of Classification Search
USPC ................. 341/118, 120, 150, 122, 136, 139, 341/156, 172
See application file for complete search history.

(56) References Cited

U.S. PATENT DOCUMENTS

| | | | |
|---|---|---|---|
| 7,324,036 B2 | 1/2008 | Petre et al. | |
| 7,834,795 B1 | 11/2010 | Dudgeon et al. | |
| 2011/0123192 A1* | 5/2011 | Rosenthal et al. | 398/43 |

OTHER PUBLICATIONS

"Compressive Sampling With a Successive Approximation ADC Architecture," International Conference on Acoustics, Speech, and Signal Processing (ICASSP), Prague, Czech Republic, May 2011, pp. 3920-3923 (Luo, et al.).

"Compressive Sensing," Lecture Notes in IEEE Signal Processing Magazine [118] Jul. 2007, pp. 118-124 (R. Baraniuk).
"Compressed Sensing with Coherent and Redundant Dictionaries," Applied and Computational Harmonic Analysis, 2010, pp. 59-73 (Candes, et al.).
"Spectral Compressive Sensing," Department of Electrical and Computer Engineering, University of masschusetts, Amherst, MA, Aug. 17, 2011, pp. 2-28 (Duarte, et al.).
"Signal Recovery from Partial Information via Orthogonal Matching Pursuit," IEEE Trans. Info Theory, 53 (12);4655-4666, Dec. 2007, (Tropp, et al.).
"Random Filters for Compressive Sampling and Reconstruction," IEEE Int. Conf. on Acoustics, Speech and Signal Processing (ICASSP), vol. III, pp. 872-875, Toulouse, France, May 2006 (Tropp, et al.).
Blind Multiband Signal Reconstruction: Compressed Sensing for Analog Signals, IEEE Transactions on Signal Processing, vol. 57, No. 3, Mar. 2009, pp. 993-1009 (Mishali, et al.).
On Sparse Reconstruction From Fourier and Gaussian Measurements, Communications on Pure and Applied Mathematics, vol. LXI, 1025-1045, 2008 (Rudelson, et al.).
"Beyond Nyquist: Efficient Sampling of Sparse Bandlimited Signals," IEEE Transactions on Information Theory, vol. 56, No. 1, Jan. 2010, pp. 520-544 (Tropp, et al.).

(Continued)

*Primary Examiner* — Joseph Lauture
(74) *Attorney, Agent, or Firm* — Alan A. R. Cooper; W. James Brady, III; Frederick J. Telecky, Jr.

(57) ABSTRACT

A calibration method to compensate for a sparsifying basis mismatch is provided. An analog signal is converted to a first digital signal at a sampling frequency that is less than a Nyquist frequency for the analog signal to generate a first digital signal. Each of a plurality of spectral terms is iteratively isolated from the first digital signal, and the offset for each of the plurality of spectral terms is iteratively determined. A dictionary is then constructed using the offset for each of the plurality of spectral terms, where the dictionary compensates for mismatch from a sparsifying basis.

12 Claims, 3 Drawing Sheets

(56) References Cited

OTHER PUBLICATIONS

"Probing the Pareto Frontier for Basis Pursuit Solutions," Siam J. Sci. Comput. c 2008 Society for Industrial and Applied Mathematics vol. 31, No. 2, pp. 890-912 (van den Berg, et al.).

"SPGL1: A solver for large-scale sparse reconstruction," Jun. 2007, http://www.cs.ubc.ca/labs/scl/spgl1.

U.S. Appl. No. 13/234,297, filed Sep. 16, 2011.

"Theory and Implementation of an Analog-to-Information Converter using Random Demodulation," IEEE Intl. Symposium on Circuits and Systems, May 27-30, 2007, pp. 1959-1962 (Laska, et al.).

"Sampling Rate Reduction for 60 GHz UWB Communication Using Compressive Sensing," Asilomar Conference on Signals, Systems & Computers, 2009, pp. 1125-1129 (Meng, et al.).

"Compressive Sensing Using Random Demodulation." Master Thesis by Benjamin Scott Boggess.

"An Introduction to Compressive Sensing," IEEE SP Magazine, Mar. 2008 (Candes, et al.).

U.S. Appl. No. 13/106,585, filed May 12, 2011.

\* cited by examiner

COMPRESSIVE SENSE BASED RECONSTRUCTION IN THE PRESENCE OF FREQUENCY OFFSET

TECHNICAL FIELD

The invention relates generally to analog-to-digital converters (ADCs) and, more particularly, to compressive sensing ADCs (CS-ADCs).

BACKGROUND

Digital compression has become ubiquitous and has been used in a wide variety of applications (such as video and audio applications). When looking to image capture (i.e., photography) as an example, an image sensor (i.e., charged-coupled device or CCD) is employed to generate analog image data, and an ADC is used to convert this analog image to a digital representation. This type of digital representation (which is raw data) can consume a huge amount of storage space, so an algorithm is employed to compress the raw (digital) image into a more compact format (i.e., Joint Photographic Experts Group or JPEG). By performing the compression after the image has been captured and converted to a digital representation, energy (i.e., battery life) is wasted. This type of loss is true for nearly every application in which data compression is employed.

Compressive sensing is an emerging field that attempts to prevent the losses associated with data compression and improve efficiency overall. Compressive sensing looks to perform the compression before or during capture, before energy is wasted. To accomplish this, one should look to adjusting the theory under which the ADCs operate, since the majority of the losses are due to the data conversion. For ADCs to perform properly under conventional theories, the ADCs should sample at twice the highest rate of the analog input signal (i.e., audio signal), which is commonly referred to as the Shannon-Nyquist rate or Nyquist frequency. Compressive sensing should allow for a sampling rate well-below the Shannon-Nyquist rate so long as the signal of interest is sparse in some arbitrary representing domain and sampled or sensed in a domain which is incoherent with respect to the representation domain.

As is apparent, a portion of compressive sensing is devoted to reconstruction (usually in the digital domain) after resolution; an example of which is described below with respect to a successive approximation register (SAR) ADC and in Luo et al., "Compressive Sensing with a Successive Approximation ADC Architecture," 2011 *Intl. Conf on Acoustic Speech and Signal Processing (ICASSP)*, pp 2590-2593. For the compressive sensing framework, a signal $\vec{y}$ can be expressed as:

$$\vec{y} = \overline{\Phi}\overline{\Psi}\vec{\alpha} = \overline{A}\vec{\alpha}, \qquad (1)$$

where $\vec{\alpha}$ (which satisfies the condition $\vec{\alpha} \in \mathfrak{R}^N$) is a frequency sparse signal, $\overline{\Psi}$ is the sparsifying basis matrix, $\overline{\Phi}$ is a row restriction of the identity matrix that provides M samples from a random set $\Omega$ (or $\overline{\Phi} = \overline{I}_{|\Omega} \in \mathfrak{R}^{M \times N}$), and $\overline{A}$ is a measurement matrix. The measurement matrix $\overline{A}$ should obey the restricted isometry property (RIP) with high probability as long as the number of measurements or samples M is sufficiently large.

As is apparent from equation (1), the reconstruction is based on an accurate sparsifying basis $\overline{\Psi}$; any mismatch from this basis limits reconstruction performance significantly. As an example, it can be assumed that basis $\overline{\Psi}$ is an inverse fast Fourier transform or IFFT matrix (which would map frequency sparse signal $\vec{\alpha}$ to the time domain). For this example, basis mismatch occurs as spectral leakage when taking random Fourier measurements. Looking to the example in FIG. 1, a discrete complex sinusoid lies at an integer frequency k is shown, and its spectrum consists of a single tone that lies on an inverse discrete Fourier Transform (IDFT) bin, indicating small to no mismatch. Looking to FIG. 2, on the other hand, the frequency discrete complex sinusoid is offset by one-half of a IDFT bin, and this causes significant spectral leakage due to the model mismatch, even though discrete complex sinusoid has a single tone.

Thus, there is a need for a method and/or apparatus that compensates for sparsifying basis mismatch.

Some conventional circuits and systems are: U.S. Pat. No. 7,324,036; U.S. Pat. No. 7,834,795; Luo et al., "Compressive Sensing with a Successive Approximation ADC Architecture," 2011 *Intl. Conf on Acoustic Speech and Signal Processing (ICASSP)*, pp 2590-2593; R. Baraniuk, "Compressive sensing," *Lecture notes in IEEE Signal Processing magazine*, 24(4):118-120, 2007; Candes et al., "Compressed sensing with coherent and redundant dictionaries," *Applied and Computational Harmonic Analysis*, 2010; Duarte et al., "Spectral compressive sensing," 2010; Eldar et al. "Compressed sensing for analog signals," *IEEE Trans. Signal Proc.*, 2008, submitted; Mishali et al. "Blind multi-band signal reconstruction: Compressed sensing for analog signals," *IEEE Trans. Signal Proc.*, 2007, submitted; Rudelson et al., "On sparse reconstruction from fourier and gaussian measurements," *Communications on Pure and Applied Mathematics*, 61(8): 1025-1045, 2008; Tropp et al., "Signal recovery from partial information via orthogonal matching pursuit," *IEEE Trans. Info. Theory*, 53(12):4655-4666, December 2007; Tropp et al., "Random_lters for compressive sampling and reconstruction," *In IEEE Int. Conf on Acoustics, Speech and Signal Processing (ICASSP)*, volume III, pages 872-875, Toulouse, France, May 2006, submitted; Tropp et al., "Beyond Nyquist: E_cient sampling of sparse bandlimited signals" 2009 Preprint; van den Berg et al., "SPGL1: A solver for large-scale sparse reconstruction," June 2007, http://www.cs.ubc.ca/labs/scl/spgl1; and van den Berg et al. "Probing the pareto frontier for basis pursuit solutions," *SIAM Journal on Scientific Computing*, 31(2):890-912, 2008.

SUMMARY

An embodiment of the present invention, accordingly, provides an apparatus. The apparatus comprises an analog-to-digital converter (ADC) that is configured to generate a first digital signal from an analog signal; and a controller that is coupled to the ADC so as to provide a sample signal to the ADC and to receive the first digital signal from the ADC, wherein the frequency of the sample signal is less than a Nyquist frequency for the analog signal, and wherein the controller generates a second digital signal from the first digital signal using a (CLEAN) dictionary that compensates for mismatch from a sparsifying basis, and wherein the dictionary is constructed by iteratively isolating each of a plurality of spectral terms and determining its offset, and wherein the second digital signal is approximately equal to an analog-to-digital conversion of the analog signal at the Nyquist frequency.

In accordance with an embodiment of the present invention, the controller further comprises a processor having a memory with a computer program embodied thereon.

In accordance with an embodiment of the present invention, the computer program further comprises: computer code for initializing a residue; and computer code for iteratively, for the plurality spectral terms, determining revising the dictionary once the residue has been initialized.

In accordance with an embodiment of the present invention, the computer code for iteratively determining coefficient values further comprises for each iteration: computer code for computing a signal proxy using the residue; computer code for identifying a coarse frequency; computer code for performing an offset estimation; computer code for adding the offset estimation to the dictionary; computer code for determining coefficient values for the dictionary; and computer code for updating the residue.

In accordance with an embodiment of the present invention, the computer code for determining coefficient values for the dictionary further comprises computer code for applying a least square algorithm to determine the coefficients.

In accordance with an embodiment of the present invention, the ADC further comprises a successive approximation register (SAR) ADC.

In accordance with an embodiment of the present invention, a method is provided. The method comprises converting an analog signal to a first digital signal at a sampling frequency that is less than a Nyquist frequency for the analog signal to generate a first digital signal; iteratively isolating each of a plurality of spectral terms from the first digital signal; iteratively determining the offset for each of the plurality of spectral terms; and constructing a dictionary using the offset for each of the plurality of spectral terms, wherein the dictionary compensates for mismatch from a sparsifying basis.

In accordance with an embodiment of the present invention, the steps of iteratively isolating, iteratively, determining, and constructing are performed in a calibration mode, and wherein the method further comprises, during an operational mode, constructing a second digital signal from the first digital signal using the dictionary such that the second digital signal is approximately equal to an analog-to-digital conversion of the analog signal at the Nyquist frequency for the analog signal.

In accordance with an embodiment of the present invention, the step of converting further comprises: sampling the analog signal at a plurality of sampling instants; and determining a digital value for the analog signal at each sampling instant.

In accordance with an embodiment of the present invention, the step of iteratively determining further comprises generating a plurality of dictionary elements.

In accordance with an embodiment of the present invention, the step of constructing further comprises: iteratively adding the plurality of dictionary elements to the dictionary; and iteratively applying a least square solution to determine the plurality of dictionary coefficients.

In accordance with an embodiment of the present invention, the analog signal is an calibration signal for the calibration mode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
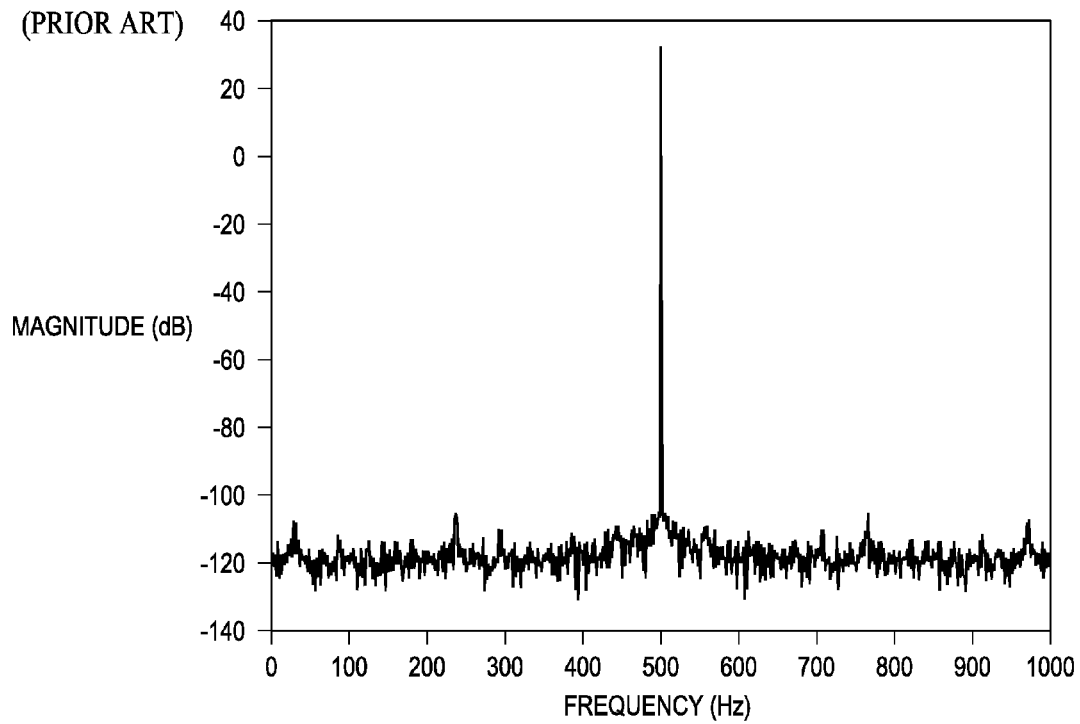
FIGS. 1 and 2 are diagrams depicting sparsifying basis mismatch.

Refer now to the drawings wherein depicted elements are, for the sake of clarity, not necessarily shown to scale and wherein like or similar elements are designated by the same reference numeral through the several views.

Figure 3:
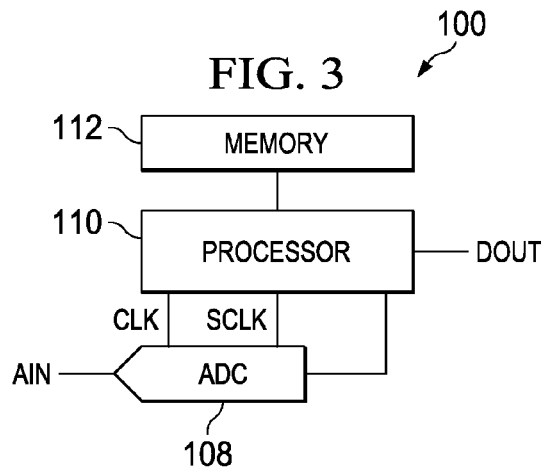
FIG. 3 is a diagram of an example of a system in accordance with an embodiment of the present invention.

Turning to FIG. 3, a diagram of a system 100 in accordance with an embodiment of the present invention can be seen. As shown, this system 100 converts the analog signal AIN into digital signal DOUT. To do this, the processor 110 (or other timing circuit) generates a sample signal SCLK and a clock signal CLK that are used by the analog-to-digital converter (ADC) 108 (which can, for example, be a successive approximation register or SAR ADC) to generate a digital signal DSN. Since the sample signal SCLK is lower than the Nyquist frequency for the signal AIN, this digital signal DSN is not a fully resolved digital signal. To arrive at the fully resolved digital signal DOUT (which is approximately equal to an analog-to-digital conversion of the analog signal AIN at the Nyquist frequency), the processor 110 and memory 112 employ a reconstruction algorithm. An example of such a reconstruction algorithm can be found in U.S. patent application Ser. No. 13/234,297, which is entitled "COMPRESSIVE SENSE BASED RECONSTRUCTION ALGORITHM FOR NON-UNIFORM SAMPLING BASED DATA CONVERTER," which was filed Sep. 16, 2011, and which is incorporated by reference herein for all purposes.

Figure 2:
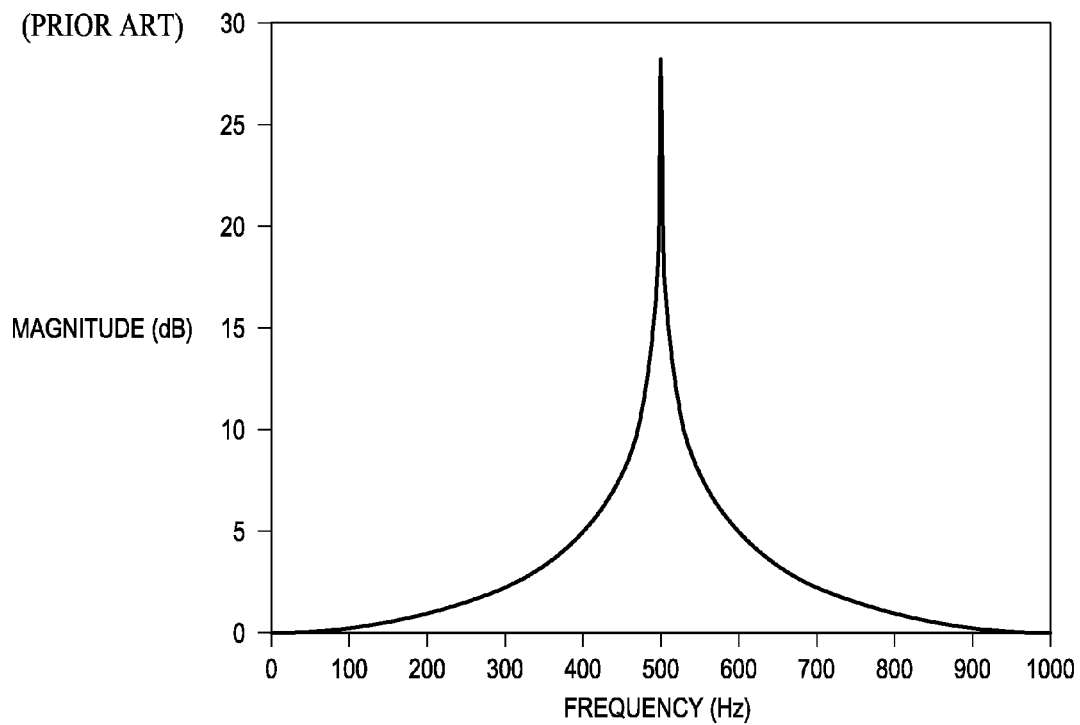
Figure 4:
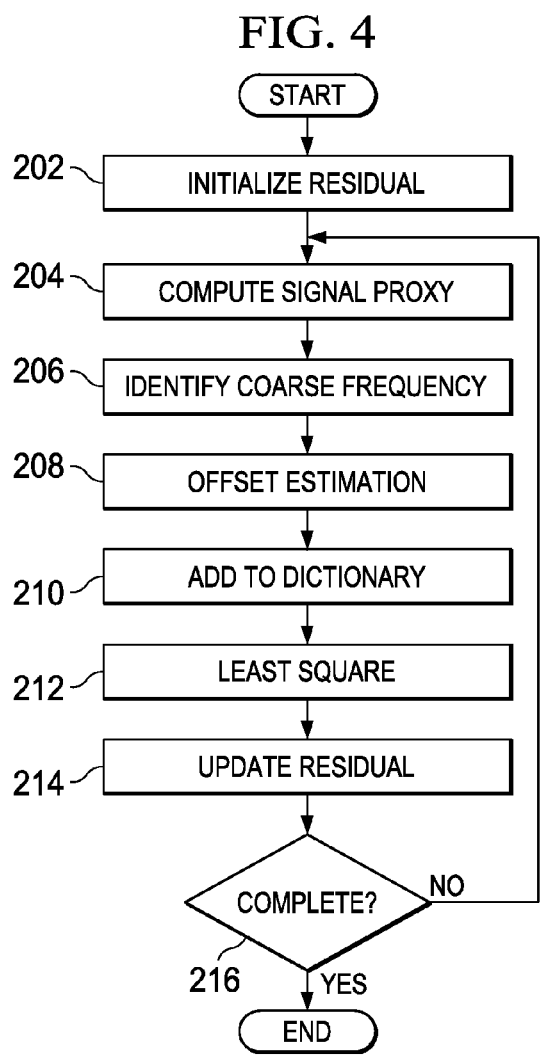
FIG. 4 is a flow chart depicting an example of a calibration algorithm used to construction a dictionary for the system of FIG. 3.

As detailed above with respect to FIGS. 1 and 2, however, there may be sparsifying basis mismatches that can inhibit reconstruction, so, in addition to employing a reconstruction algorithm, processor 110 and memory 112 also include a basis mismatch adjustment algorithm (which is shown in FIG. 4). This algorithm can be referred to as an "Offset Orthogonal Matching Pursuit" or OffsetOMP. The OffsetOMP uses a dictionary $\overline{D}$ that compensates for mismatch from a sparsifying basis, which is constructed by iteratively isolating each of all or substantially all K spectral terms and determining offsets. Initially, in step 202, the residue $\vec{r}$ is initialized by setting it to signal DSN (which can is represented below by $\vec{y}$). The signal proxy $\vec{p}$ is then calculated in step by:

$$\vec{p} = \overline{A^*}\vec{r} \quad (2)$$

The coarse frequency $\lambda_i$ (for iteration i) is identified (which is typically identification of the largest spectral term) in step 206 by:

$$\lambda_i = arg\,max|\vec{p}_i| \quad (3)$$

An offset estimation $\Delta_i$ (again for iteration i) is then determined in step 208 by:

$$\Delta_i = \arg\max \Delta \left\langle \vec{r}, e^{-j2\pi(\lambda_i+\Delta)n\Omega/N} \right\rangle \quad (4)$$

With the offset estimation $\Delta_1$, it can be added to the dictionary $\overline{D}$ in step 210 by:

$$\overline{D} = [\overline{D} e^{-j2\pi(\lambda_i+\Delta)n\Omega/N}] \quad (5)$$

A least square algorithm can then be applied in step 212 to solve for the coefficient values for the current dictionary of equation (5) by:

$$\alpha = \arg\max_x \|\vec{y} - \overline{D}\vec{x}\|_2 \quad (6)$$

The residue $\vec{r}$ is then updated in step 214 by:

$$\vec{r} = \vec{y} - \overline{D}\alpha \quad (7)$$

Figure 5:
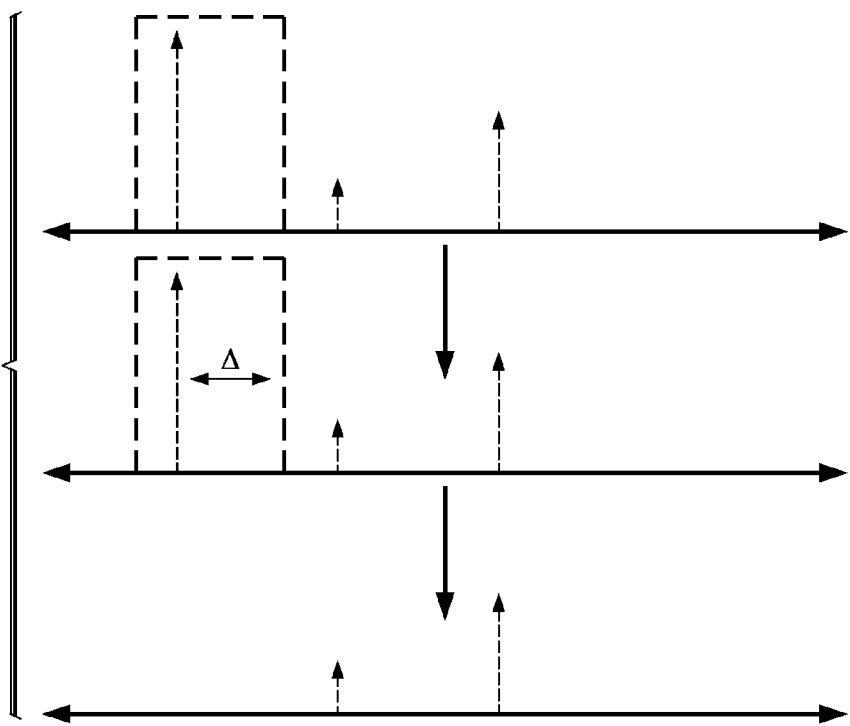
FIGS. 5 and 6 are diagrams depicting an example operation of the algorithm of FIG. 4.

This process is then repeated for all K spectral terms in step 216. An example of this process can be seen in FIG. 5, where the two largest spectral terms. This adjustment to the dictionary $\overline{D}$ is usually performed during a calibration mode, while resolution (using a reconstruction algorithm) of the digital signal DOUT is carried out during an operational mode. This adjustment can also be determined using a calibration signal (i.e., single tone sinusoid) or "of the fly" using analog input signal AIN.

Figure 6:
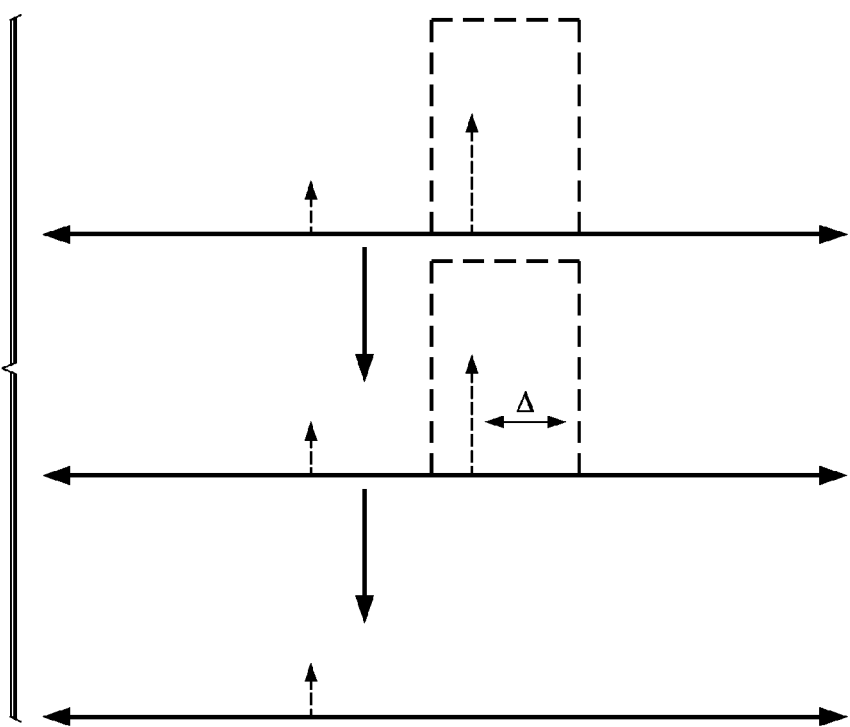

Turning to FIG. 6, a comparison between a conventional OMP algorithm and the OffsetOMP algorithm can be seen. For this example, there are two spectral terms (K=2). As shown, there is a 14 dB improvement using the OffsetOMP algorithm when the normalized offset approaches 0.5.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an analog-to-digital converter (ADC) that is configured to generate a first digital signal from an analog signal; and
   a controller that is coupled to the ADC so as to provide a sample signal to the ADC and to receive the first digital signal from the ADC, wherein the frequency of the sample signal is less than a Nyquist frequency for the analog signal, and wherein the controller generates a second digital signal from the first digital signal using a dictionary that compensates for mismatch from a sparsifying basis, and wherein the dictionary is constructed by iteratively isolating each of a plurality of spectral terms and determining its offset, and wherein the second digital signal is approximately equal to an analog-to-digital conversion of the analog signal at the Nyquist frequency.

2. The apparatus of claim 1, wherein the controller further comprises a processor having a memory with a computer program embodied thereon.

3. The apparatus of claim 2, wherein the computer program further comprises:
   computer code for initializing a residue; and
   computer code for iteratively, for the plurality spectral terms, determining revising the dictionary once the residue has been initialized.

4. The apparatus of claim 3, wherein the computer code for iteratively determining coefficient values further comprises for each iteration:
   computer code for computing a signal proxy using the residue;
   computer code for identifying a coarse frequency;
   computer code for performing an offset estimation;
   computer code for adding the offset estimation to the dictionary;
   computer code for determining coefficient values for the dictionary; and
   computer code for updating the residue.

5. The apparatus of claim 4, wherein the computer code for determining coefficient values for the dictionary further comprises computer code for applying a least square algorithm to determine the coefficients.

6. The apparatus of claim 5, wherein the ADC further comprises a successive approximation register (SAR) ADC.

7. A method comprising:
   converting an analog signal to a first digital signal at a sampling frequency that is less than a Nyquist frequency for the analog signal to generate a first digital signal;
   iteratively isolating each of a plurality of spectral terms from the first digital signal;
   iteratively determining the offset for each of the plurality of spectral terms; and
   constructing a dictionary using the offset for each of the plurality of spectral terms, wherein the dictionary compensates for mismatch from a sparsifying basis.

8. The method of claim 7, wherein the steps of iteratively isolating, iteratively, determining, and constructing are performed in a calibration mode, and wherein the method further comprises, during an operational mode, constructing a second digital signal from the first digital signal using the dictionary such that the second digital signal is approximately equal to an analog-to-digital conversion of the analog signal at the Nyquist frequency for the analog signal.

9. The method of claim 8, wherein the step of converting further comprises:
   sampling the analog signal at a plurality of sampling instants; and
   determining a digital value for the analog signal at each sampling instant.

10. The method of claim 9, wherein the step of iteratively determining further comprises generating a plurality of dictionary elements.

11. The method of claim 10, wherein the step of constructing further comprises:
    iteratively adding the plurality of dictionary elements to the dictionary; and
    iteratively applying a least square solution to determine the plurality of dictionary coefficients.

12. The method of claim 11, wherein the analog signal is an calibration signal for the calibration mode.

* * * * *